US007872481B1

(12) United States Patent
Goeke et al.

(10) Patent No.: US 7,872,481 B1
(45) Date of Patent: Jan. 18, 2011

(54) LOW GLITCH MULTIPLE FORM C SUMMING NODE SWITCHER

(75) Inventors: Wayne C. Goeke, Hudson, OH (US); Martin J. Rice, Sagamore Hills, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 341 days.

(21) Appl. No.: 12/113,391

(22) Filed: May 1, 2008

(51) Int. Cl.
*G01R 31/302* (2006.01)

(52) U.S. Cl. ...................... 324/750; 324/771; 324/764; 324/763

(58) Field of Classification Search ................ 324/750, 324/771, 764, 763, 759, 775
See application file for complete search history.

(56) References Cited

U.S. PATENT DOCUMENTS 5,039,934 A 8/1991 Banaska
5,652,524 A * 7/1997 Jennion et al. .............. 324/765
6,268,735 B1 * 7/2001 Craig et al. ................. 324/603
7,714,603 B2 * 5/2010 Eldridge et al. ............. 324/765
2006/0152236 A1 * 7/2006 Kim ........................... 324/755

* cited by examiner

*Primary Examiner*—Bao Q Vu
*Assistant Examiner*—Nguyen Tran
(74) *Attorney, Agent, or Firm*—Pearne & Gordon LLP

(57) ABSTRACT

A measurement system with selectable feedback paths includes a DUT interface including a first and a second DUT sensor, the first sensor being connected to a first feedback path for providing a measure of a first DUT characteristic, the second sensor being connected to a second feedback path for providing a measure of a second DUT characteristic, the sensors having a shared reference path and each feedback path including a set point adjustment; a differential amplifier system including differential inputs and differential outputs, the differential outputs being applied to the DUT interface; and a multi-pole switcher for connecting the differential inputs to either the first feedback path and the reference path or to the reference path and the second feedback path, respectfully. The first feedback path is selected to produce a desired first DUT characteristic or the second feedback path is selected to produce a second desired DUT characteristic.

6 Claims, 5 Drawing Sheets

LOW GLITCH MULTIPLE FORM C SUMMING NODE SWITCHER

BACKGROUND OF THE INVENTION

The present invention relates to electrical measurement systems and, in particular, to those using feedback techniques to establish desire conditions at a device under test (DUT).

In various applications, it is often required to have a voltage source operating at given voltage unless certain current limits are exceeded. Such voltage sources, for example, allow the testing of various circuits and components while minimizing the chance of damage to either the item under test or the voltage source.

Similarly, it is often required to have a current source operating at a given current unless certain voltage limits are exceeded.

Rather than having both a voltage source and a current source, it is useful to have one apparatus that can act as a current-limited voltage source or a voltage-limited current source. However, such an apparatus must be able to control all four possible quadrants of operation. It must be able to handle positive or negative voltage in combination with positive or negative current. Voltage and current of opposite polarity can occur if the device connected to the apparatus can also act as a source of current or voltage. This may be no more than, for example, a capacitive load connected to the apparatus when the value of the voltage source is lowered, the capacitor seeking to discharge its then excess charge through the apparatus.

An apparatus that can act as a current-limited voltage source or a voltage-limited current source and that operates in all four possible quadrants of operation is taught in U.S. Pat. No. 5,039,934, which is incorporated herein by reference.

BRIEF SUMMARY OF THE INVENTION

A measurement system with selectable feedback paths includes a DUT interface including a first and a second DUT sensor, the first sensor being connected to a first feedback path for providing a measure of a first DUT characteristic, the second sensor being connected to a second feedback path for providing a measure of a second DUT characteristic, the sensors having a shared reference path and each feedback path including a set point adjustment; a differential amplifier system including differential inputs and differential outputs, the differential outputs being applied to the DUT interface; and a multi-pole switcher for connecting the differential inputs to either the first feedback path and the reference path or to the reference path and the second feedback path, respectfully. The first feedback path is selected to produce a desired first DUT characteristic or the second feedback path is selected to produce a second desired DUT characteristic.

DESCRIPTION OF EXAMPLE EMBODIMENTS OF THE INVENTION

Figure 1:
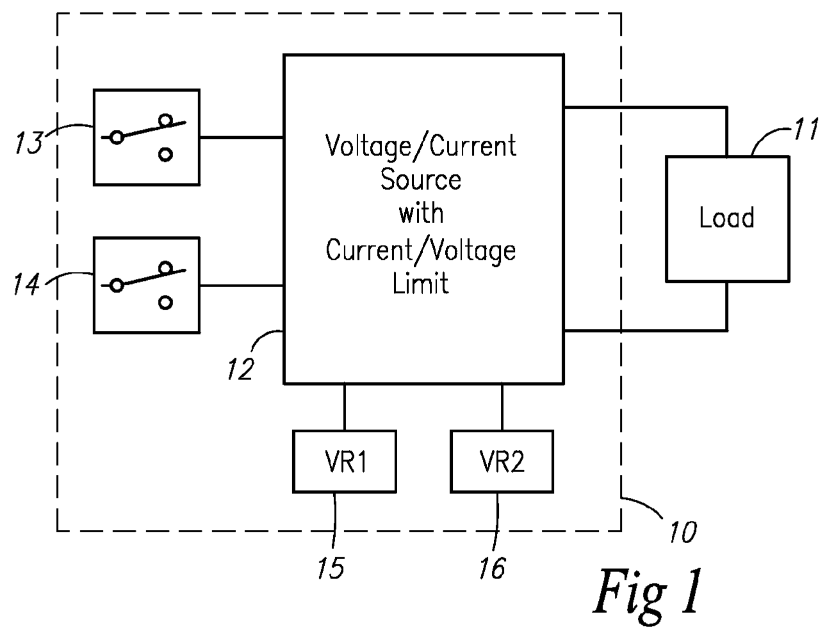
FIG. 1 is a schematic block diagram of an apparatus for providing a current-limited voltage or a voltage-limited current to a connected device.

FIG. 1 shows a schematic block diagram of an apparatus 10 for providing a current-limited voltage or a voltage-limited current to a connected device 11. In FIG. 1, the connected device 11 is shown as a load. However, it is to appreciated that the connected device 11 could alternatively supply electrical energy to the apparatus 10. The apparatus 10 is configured to limit current or limit voltage when either supplying electrical energy to the device 11 or receiving electrical energy from the device 11.

The apparatus 10 includes a circuit for 12 for providing a current-limited voltage or a voltage-limited current to the connected device 11. The circuit 12 includes a first switch 13 and a second switch 14. In an embodiment, the first and second switches 13, 14 have a Form C configuration, such as a single pole, double throw configuration, for example. That is, the switches 13, 14 have a common terminal, a normally-closed contact, and a normally open contact. As used herein, the terms "Form C" include separate switches that are configured to provide a common terminal, a normally-closed contact, and a normally-open contact, such as the combination of a Form A switch (normally-open) and a Form B switch (normally-closed), for example. The switches 13, 14 can be manually operable or they can be automatically controlled. For example, the switches 13, 14 can be embodied in one or more relay devices, such as electromechanical or solid-state relay devices. The relay devices can be automatically actuated by controller in the circuit 12. In an embodiment, the controller includes a microprocessor that executes a control program stored in a memory.

The apparatus 10 can be configured as any one of a current-limited positive voltage source, a current-limited negative voltage source, a voltage-limited positive current source, and a voltage-limited negative current source. The configuration of the apparatus 10 is based on the positions of the first and second switches 13, 14. The switches 13, 14 are shown in their non-asserted or logical 0 state. It is to be appreciated that each switch 13, 14 can also assume an asserted or logical 1 state (not shown). The apparatus 10 is configured as a current-limited positive voltage source when the first switch 13 and the second switch 14 are set to the logical 0, 0 states, respectively. The apparatus 10 is configured as a voltage-limited positive current source when the first switch 13 and the second switch 14 are set to the logical 0, 1 states, respectively. The apparatus 10 is configured as a voltage-limited negative current source when the first switch 13 and the second switch 14 are set to the logical 1, 0 states, respectively. The apparatus 10 is configured as a current-limited negative voltage source with the first switch 13 and the second switch 14 are set to the logical 1, 1 states, respectively.

The circuit 12 includes a first reference voltage 15 and a second reference voltage 16. The circuit 12 further includes an internal source resistance (not shown) in series with the second reference voltage 16. When operating as a current-limited positive voltage source or a current-limited negative voltage source, the circuit 12 applies the first reference voltage to the connected device 11 until the current through the device 11 exceeds a current limit or threshold current. After the current limit is reached, the circuit 12 applies the second reference voltage 16 to the source resistance to generate a current that is provided to the connected device 11.

When operating as a voltage-limited positive current source or a voltage-limited negative current source, the circuit 12 applies the second reference voltage 16 to the source resistance to supply current to the device 11 until the voltage across the device 11 exceeds a voltage limit or threshold voltage. After the voltage limit is reached, the circuit 12 applies the first reference voltage to the connected device 11.

Figure 2:
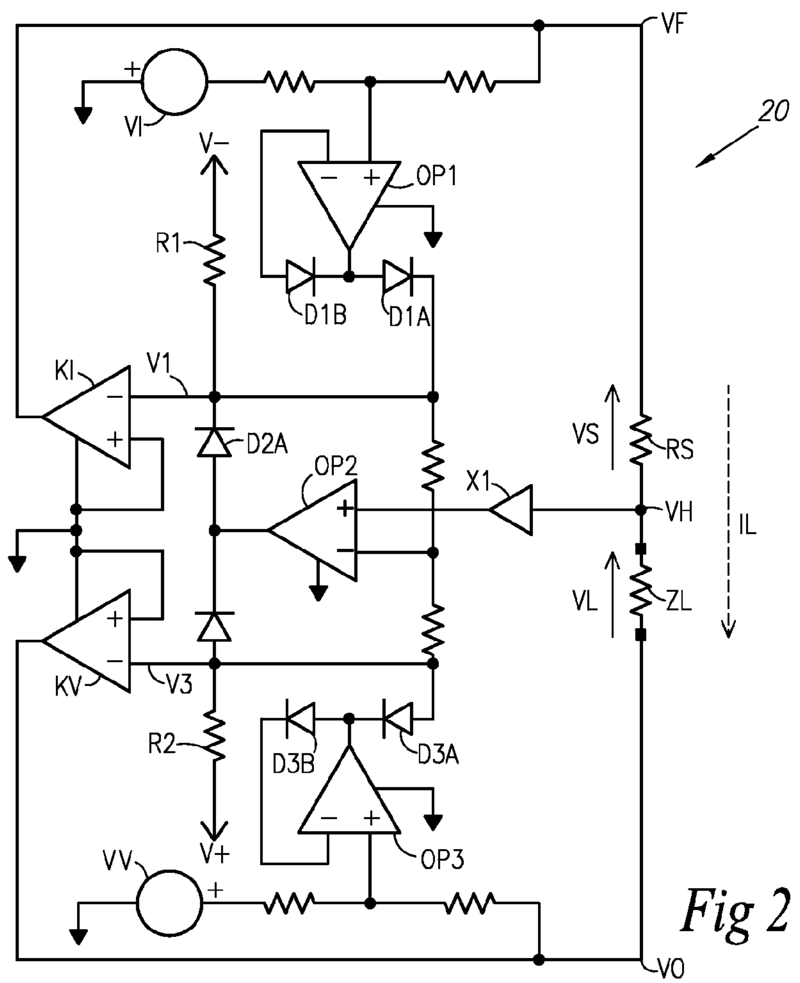
FIG. 2 is a schematic diagram of a circuit for providing a current-limited voltage to a connected device.

FIG. 2 is schematic diagram of a circuit 20 for providing a current-limited voltage to a connected device. The circuit 20 lacks switches for configuring the circuit as a voltage-limited current source. Therefore, the circuit 20 is operable only as a current-limited voltage source.

A load ZL is connected to the circuit 20, and the circuit 20 supplies current-limited voltage to the load ZL.

The circuit includes an operational amplifier KI and another operational amplifier KV. The operational amplifier KI sources current to the load ZL and the operational amplifier KV sinks current from the load ZL. The operational amplifier KI is directly connected to a summing node V1. A negative bias voltage V− is connected to the summing node V1 through a negative bias resistor R1. The negative bias voltage V− draws current from the summing node V1 through the negative bias resistor R1, which biases the operational amplifier KI. Biasing the operational amplifier KI as described causes voltage VF to rise and current flow IL occurs through a source resistance RS that is in series with the load ZL. Voltage VF rises until an operational amplifier OP1 or an operational amplifier OP2 forces current into the summing node V1 through diode D1A or diode D2A, respectively.

The operational amplifier KV is directly connected to a summing node V3. A positive bias voltage V+ is connected to the summing node V3 through a positive bias resistor R2. The positive bias voltage V+ drives current into the summing node V3 through the positive bias resistor R2, which biases the operational amplifier KV. Similar to the operational amplifier KI, biasing the operational KV as described causes voltage V0 to fall and current flow IL occurs through the source resistance RS and the load ZL. Voltage V0 falls until the operational amplifier OP2 or an operational amplifier OP3 forces current into the summing node V3 through diode D2A or D3A, respectively.

The circuit 20 includes a first reference voltage VV for providing a specific voltage to the load ZL and a second reference voltage V1 for providing a specific current to the load ZL, as will be described further below. The current flow IL through the load ZL generates a voltage VL across the load ZL. The current flow IL through the source resistance RS generates a voltage VS across the source resistance RS.

The current limit or threshold of the circuit 20 is the ratio of the second reference voltage V1 to the source resistance RS, or VI/RS. When VI/RS is greater than the ratio of the first reference voltage VV to the impedance of the load ZL, or VV/ZL, the circuit 20 forces the first reference voltage VV onto the load ZL. In this case, the circuit 20 supplies voltage VV to the load ZL. When VI/RS is greater than VV/ZL, the operational amplifier OP2 controls the summing node V1 and the operation of the operational amplifier KI. Meanwhile, the operational amplifier OP3 controls the summing node V3 and the operation of the operational amplifier KV.

When VI/RS is less than VV/ZI, the circuit 20 enters a current-limiting mode of operation. The circuit 20 forces the second reference voltage V1 onto the source resistance RS. The first reference voltage VV is not supplied to the load ZL. The current IL through the source resistance RS also flows through the load ZL, limiting the current IL through the load ZL to VI/RS. While in the current-limiting mode of operation, the operational amplifier OP1 controls the summing node V1 and the operation of the operational amplifier KI. Meanwhile, the operational amplifier OP2 controls the summing node V3 and the operation of the operational amplifier KV. Therefore, in the circuit 20, the operational amplifier OP2 controls either one of the operational amplifiers KI and KV.

When VI/RS is equal to VV/ZL, the operational amplifier OP1 controls the operation of the operational amplifier KI and the operational amplifier OP3 controls the operation of the operational amplifier KV. Diode D1B allows operational amplifier OP1 to remain in a linear mode when not controlling operational amplifier KI. Similarly, diode D3B allows the operational amplifier OP3 to remain in a linear mode when not controlling the operational amplifier KV. Voltage VH is a virtual ground that is provided to the non-inverting input of the operational amplifier OP2 through a buffer X1. As used herein, the term "ground" refers generally to a common potential reference.

The circuit 20 operates as discussed above when the reference voltages VV and VI are positive voltages. In order to operate with negative reference voltages VV and VI, the diodes shown would have to be reversed, along with the polarity of the positive and negative bias voltages V+, V−. Furthermore, the circuit does not act as a voltage-limited current source.

Figure 3:
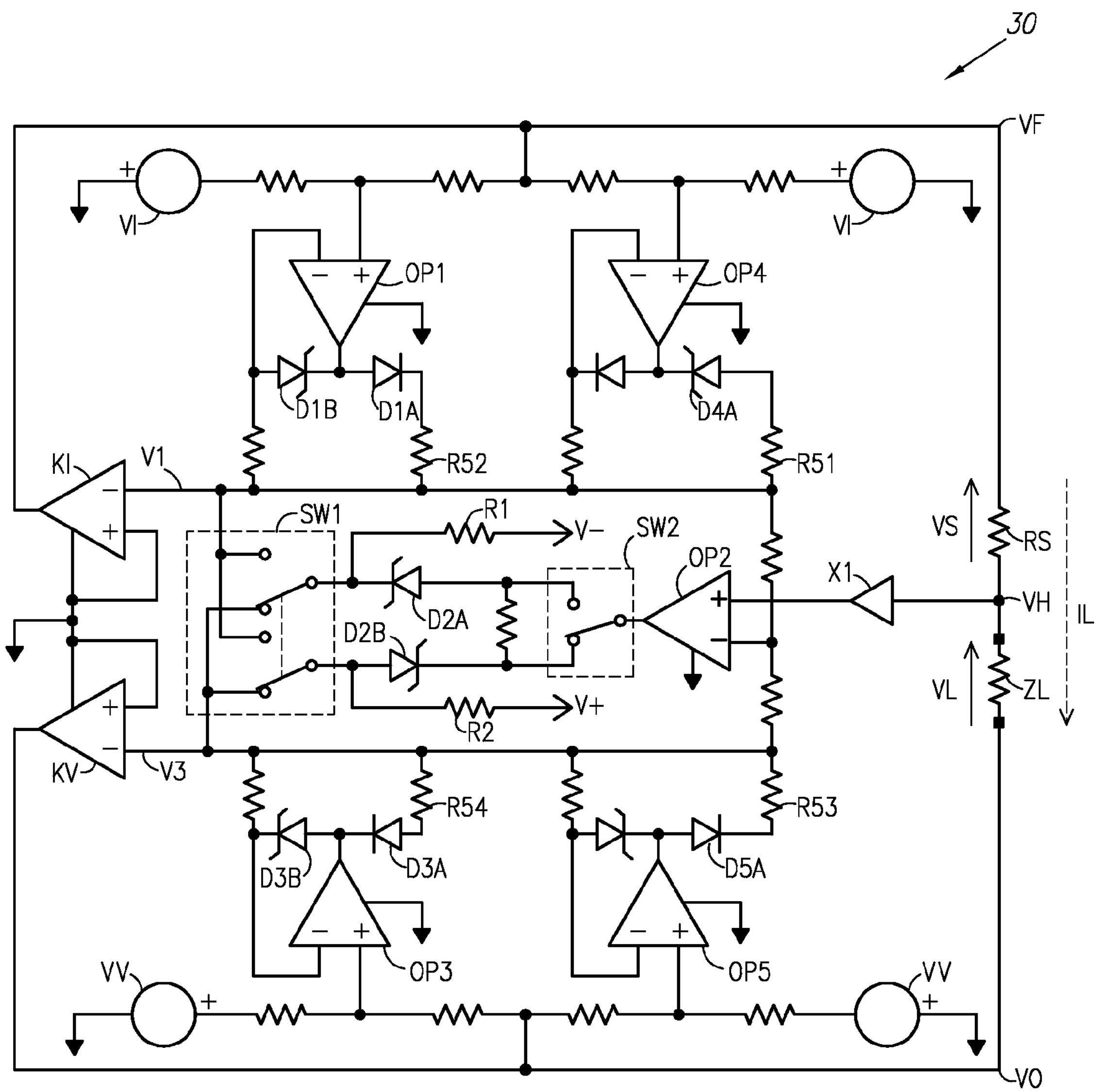
FIG. 3 is a schematic diagram of a circuit for providing a current-limited voltage or a voltage-limited current to a connected device.

Turning to FIG. 3, circuit 30 provides a modification of circuit 20. Circuit 30 is a four-quadrant source, capable of selectively acting as a current-limiting positive or negative voltage source or a voltage-limiting positive or negative current source. The circuit 30 includes a switch SW1 and a switch SW2. The switch SW1 includes operationally interlocked single pole, double throw switches or interlocked dual Form C switches. The switch SW2 provides one single pole, double throw switch. As discussed above with respect to FIG. 1, the switches SW1 and SW2 may be manually operated switches or may be controlled by a controller, such as a controller having a microprocessor. The switches SW1 and SW2 are shown in their non-asserted or logical 0 states, in which the switches' movable poles contact normally closed contacts. It is to be appreciated that each switch SW1 and SW2 can also assume an asserted or logical 1 state (not shown) in which the switches' movable poles contact normally open contacts.

The operational mode of the circuit 30 is based on the positions of the switches SW1 and SW2. The circuit 30 is configured as a current-limited positive voltage source when the switch SW1 and the switch SW2 are set to the logical 0, 0 states, respectively. The circuit 30 is configured as a voltage-limited positive current source when the switch SW1 and the switch SW2 are set to the logical 0, 1 states, respectively. The circuit 30 is configured as a voltage-limited negative current source when the switch SW1 and the switch SW2 are set to the logical 1, 0 states, respectively. The circuit 30 is configured as a current-limited negative voltage source when the switch SW1 and the switch SW2 are set to the logical 1, 1 states, respectively.

The circuit 30 includes the operational amplifier OP1 for supplying current into the summing node V1 through the diode D1A. The circuit 30 further includes an operational amplifier OP4 for removing current from the summing node V1 through a diode D4A.

The circuit 30 includes the operational amplifier OP3 for removing current from the summing node V3 through the diode D3A. The circuit 30 further includes an operational amplifier OP5 for removing current from the summing node V3 through the diode D5A The first reference voltage VV and the second reference voltage V1 are positive voltages. The negative bias voltage V− is selectively connected to one of the summing node V1 and the summing node V3 through the negative bias resistor R1, based on the state of the switch SW1. The positive bias voltage V+ is selectively connected to the other one of the summing node V1 and the summing node V3 through the positive bias resistor R2, based on the state of the switch SW1.

When the circuit 30 is configured as a current-limited positive voltage source, as shown in FIG. 3, the negative bias voltage V− biases the operational amplifier KI, causing voltage VF to rise, and current flow IL occurs through the source resistance RS that is in series with load ZL. The positive bias voltage V+biases the operational amplifier KV, causing voltage V0 to fall, and current flow IL occurs through the source resistance RS and the load ZL.

When VI/RS is greater than VV/ZL, the circuit 30 forces the first reference voltage VV on the load ZL and, therefore, supplies voltage VV to the load ZL. In this case, the operational amplifier OP2 controls the operation of the operational amplifier KI and the operational amplifier OP3 controls the operation of the operational amplifier KV.

When VI/RS is less than VV/ZI, the circuit 30 enters a current-limiting mode of operation. The circuit 30 forces the second reference voltage V1 onto the source resistance RS. The first reference voltage VV is not supplied to the load ZL. The current IL through the source resistance RS also flows through the load ZL, limiting the current IL through the load ZL to VI/RS. While in the current-limiting mode of operation, the operational amplifier OP1 controls the operation of the operational amplifier KI and the operational amplifier OP2 controls the operation of the operational amplifier KV.

It is possible that the load ZL could source current to the circuit 30 while the circuit 30 is configured as a current-limited positive voltage source. If ZL sources enough current, the operational amplifier OP4 will start to down the voltage at the summing node V1. The operational amplifier OP2 will work to counter the operational amplifier OP4 current. A resistor R0 has a larger resistance value than a resistor R51, which ensures that the operational amplifier OP4 gains control of the summing node V1. The output of the operational amplifier OP2 will rise until it overcomes the zener diode D2B, which puts the operational amplifier OP2 and the operational amplifier OP3 vying for control of the summing node V3. However, the operational amplifier OP3 is vying for control through the resistor R54, while the operational amplifier OP2 has no resistor in series with its output. Therefore, the operational amplifier OP2 will gain control of the summing node V3 and the voltage VL will increase, which resists the flow of current from the load ZL. The circuit 30 includes resistor R52, which is associated with the operational amplifier OP1, and resistor R53, which is associated with operational amplifier OP5. The resistors R52 and R53 provide a similar function as described above regarding the resistors R51 and R54.

Figure 4:
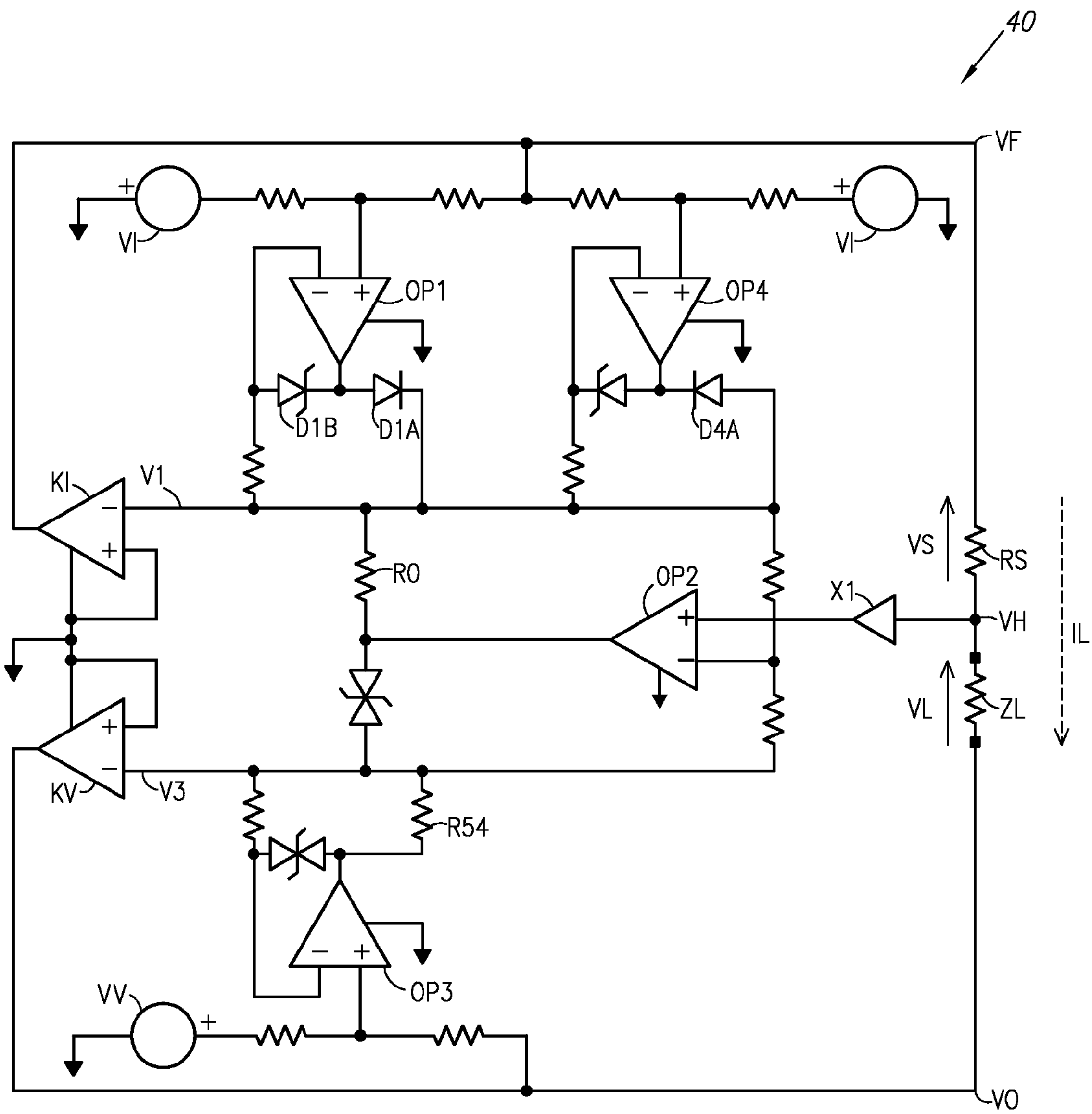
FIG. 4 is a schematic diagram of a circuit for providing a current-limited voltage to a connected device.

Turning to FIG. 4, circuit 40 provides a modification of circuit 30. The circuit 40 lacks the switches SW1 and SW2 of the circuit 30. The circuit 40 is configured as a voltage source. Whether the circuit 40 supplies a positive voltage or a negative voltage depends on the value of the first reference voltage VV, which can be positive or negative. During a current limiting mode of operation, the resistor R0 ensures that either the operational OP1 or the operational amplifier OP4 will gain control of the summing node V1 from the operational amplifier OP2. The resistor R54 ensures that the operational amplifier OP2 will then gain control of the summing node V3 from the operational amplifier OP3.

Figure 5:
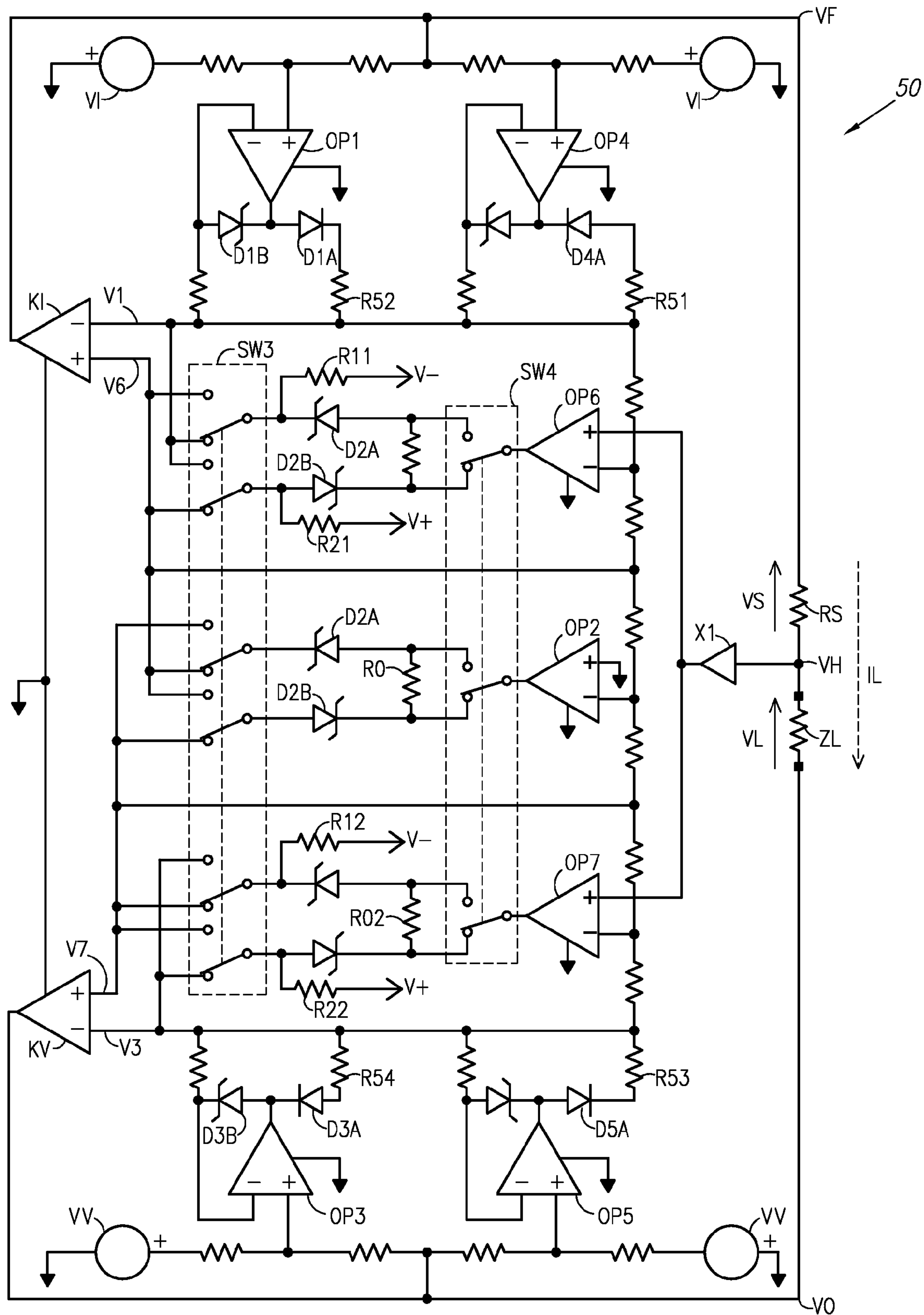
FIG. 5 is a schematic diagram of a circuit for providing a current-limited voltage or a voltage-limited current to a connected device.

Turning to FIG. 5, circuit 50 provides a modification of circuit 30. The switch SW3 replaces the switch SW1. The switch SW3 includes 6 operationally interlocked single pole, double throw switches. The switch SW4 replaces the switch SW2. The switch SW4 includes 3 operationally interlocked single pole, double throw switches. The switches SW3 and SW4 are shown in their non-asserted or logical 0 state. The operational mode of the circuit 50 is based on the positions of the switches SW3 and SW4. The circuit 50 is configured as a current-limited positive voltage source when the switch SW3 and the switch SW4 are set to the logical 0, 0 states, respectively. The circuit 50 is configured as a voltage-limited positive current source when the switch SW3 and the switch SW4 are set to the logical 0, 1 states, respectively. The circuit 50 is configured as a voltage-limited negative current source when the switch SW3 and the switch SW4 are set to the logical 1, 0 states, respectively. The circuit 50 is configured as a current-limited negative voltage source when the switch SW3 and the switch SW4 are set to the logical 1, 1 states, respectively.

The non-inverting inputs of the operational amplifiers KV and KI are not directly connected to ground, as in the circuit 30. The non-inverting input of the operational amplifier KV is connected to one of the positive bias voltage V+ through positive bias resistor R22 and the negative bias voltage V− through negative bias resistor R12, based on the state of the switch SW3. The non-inverting input of the operational amplifier KI is connected to the other one of the positive bias voltage V+ through positive bias resistor R21 and the negative bias voltage V− through negative bias resistor R11. The non-inverting input of the operational amplifier KI is directly connected to node V6. The non-inverting input of the operational amplifier KV is directly connected to node V7.

The non-inverting input of the operational amplifier OP2 is directly connected to ground. The circuit 50 includes an operational amplifier OP6 and associated resistor R01. The circuit 50 further includes an operational amplifier OP7 and associated resistor R07.

When the circuit 50 is configured as a current-limited positive voltage source, as shown in FIG. 5, if VI/RS is greater than VV/ZL, the circuit 50 forces the first reference voltage VV on the load ZL and, therefore, supplies voltage VV to the load ZL. The operational amplifier OP6 controls the summing node V1, the operational amplifier OP2 control the node V6, the operational amplifier OP7 controls the node V7, and the operational amplifier OP3 controls the summing node V3.

When VI/RS is less than VV/ZL, the circuit 50 enters a current limiting mode of operation. The circuit 50 forces the second reference voltage V1 onto the source resistance RS. The first reference voltage VV is not supplied to the load ZL. The current IL through the source resistance RS also flows through the load ZL, limiting the current IL through the load ZL to VI/RS. While in the current-limiting mode of operation, the operational amplifier OP1 controls the summing node V1, the operational amplifier OP6 controls the node V6, the operational amplifier OP2 controls the node V7 and the operational amplifier OP7 controls the node V3.

Figure 6:
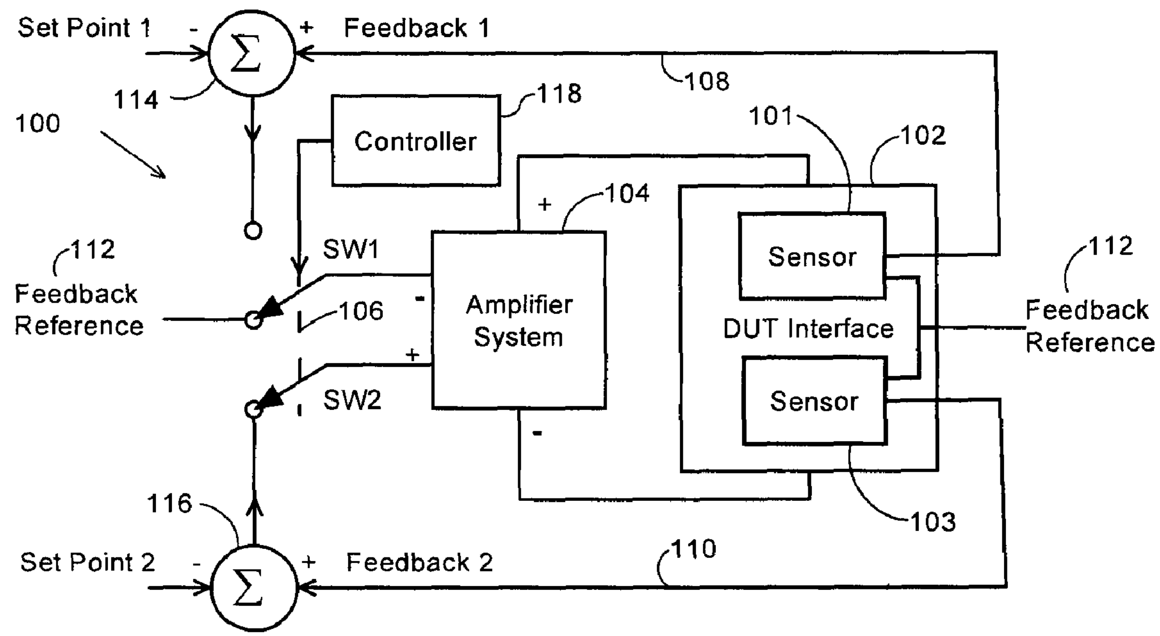
FIG. 6 is a block diagram of a measurement system according to an aspect of the invention.

Referring to FIG. 6, a measurement system 100 includes a DUT (device under test) interface 102, a differential amplifier system 104 and a multi-pole switch 106.

The DUT interface 102 includes a first DUT sensor 101 and a second DUT sensor 103 (e.g., a sense resistor that is placed in series with a DUT to provide a measure of current through the DUT and a voltage sensor across the DUT). The first sensor 101 is connected to a first feedback path 108. The second sensor 103 is connected to a second feedback path 110. A reference path 112 serves sensors 101, 103 (e.g., a common terminal between a serial sense resistor and a voltage sensor). The feedback paths 108, 110 have a respective set point adjustment 114, 116 for adjusting the desired value of a DUT characteristic at the DUT interface 102 (e.g., DUT current, DUT voltage).

The multi-pole switch pole 106 selects which of the feedback paths 108, 110 is in control. In the position shown, feedback path 110 will result in the system 100 having the desired DUT characteristic corresponding to set point 2. If the two poles SW1, SW2 are switched up, the feedback path 108 will result in the system 100 having the desired DUT characteristic corresponding to set point 1.

The switching of the switch 106 may be controlled by a controller 118 that is responsive to parameter values measured in the system 100. For example, it may act to limit voltage or current in the DUT.

The DUT interface 102 may include sensors for any relevant DUT parameters. For example, besides the already mentioned voltage and current, other possibilities include: power, impedance, pressure, temperature, frequency, etc.

It should be noted that with loop lock, the poles of the multi-pole switch will be at virtually the same voltages. As a result, when the switch is switched, there is little immediate change to the differential inputs, resulting in low-glitch operation of the system.

Figure 7:
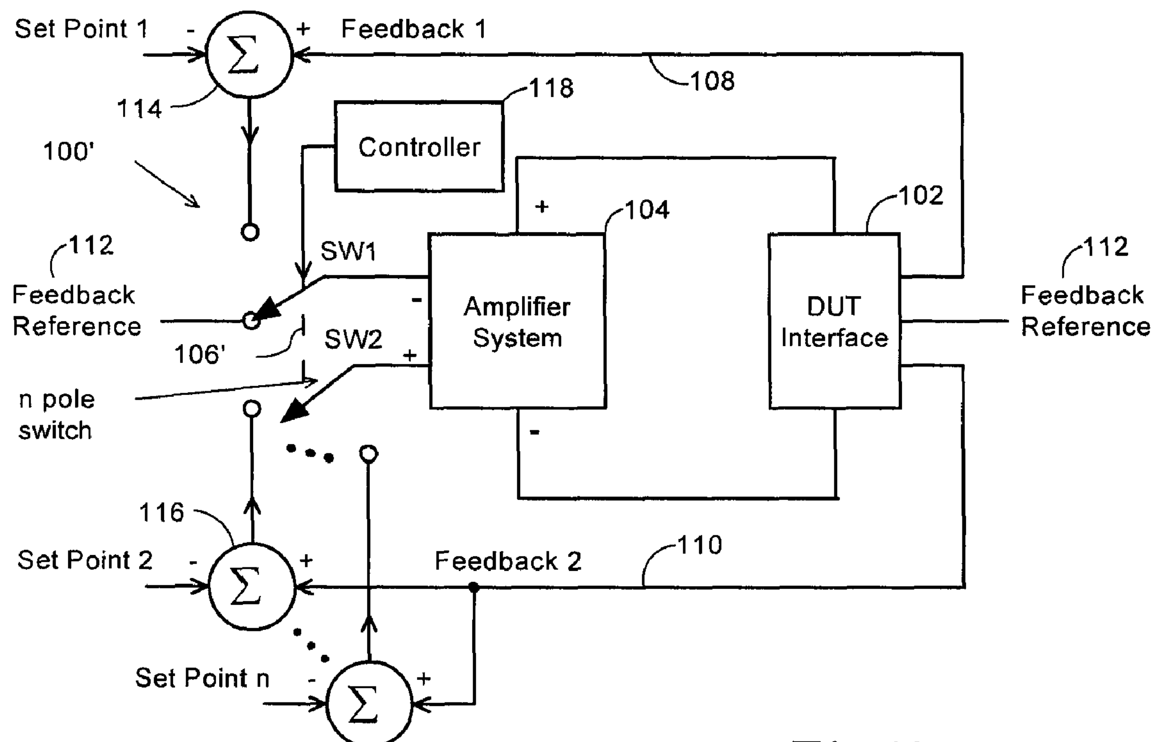
FIG. 7 is a block diagram of another measurement system according to an aspect of the invention.

Referring to FIG. 7, a measurement system 100' includes an n-pole switch 106' instead of the two-pole switch 106 of FIG. 6. This may be used for additional feedback paths from the DUT interface 102 or, as shown, to permit the selection of different set points (e.g. set point n).

The measurement systems 100, 100' may be further generalized if the measurement systems 100, 100' are viewed simply as control systems, where the DUT interface is just considered a load system and the DUT sensors are parameter sensors for sensing parameters of the load system.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A measurement system with selectable feedback paths, comprising:

a DUT interface including a first and a second DUT sensor, said first sensor being connected to a first feedback path for providing a measure of a first DUT characteristic, said second sensor being connected to a second feedback path for providing a measure of a second DUT characteristic, said sensors having a shared reference path and each feedback path including a set point adjustment;

a differential amplifier system including differential inputs and differential outputs, said differential outputs being applied to said DUT interface; and a multi-pole switcher for connecting said differential inputs to either said first feedback path and said reference path or to said reference path and said second feedback path, respectfully, wherein said first feedback path is selected to produce a desired first DUT characteristic or said second feedback path is selected to produce a second desired DUT characteristic.

2. A measurement system according to claim 1, further comprising a controller responsive to at least one of said DUT characteristic measures to control the switcher.

3. A measurement system according to claim 1, wherein said first sensor provides a measure of current through the DUT and the second sensor provides a measure of voltage across the DUT.

4. A control system with selectable feedback paths, comprising:

a load system including a first and a second parameter sensor, said first sensor being connected to a first feedback path for providing a measure of a first load system parameter, said second sensor being connected to a second feedback path for providing a measure of a second load system parameter, said sensors having a shared reference path and each feedback path including a set point adjustment;

a differential amplifier system including differential inputs and differential outputs, said differential outputs being applied to said load system; and a multi-pole switcher for connecting said differential inputs to either said first feedback path and said reference path or to said reference path and said second feedback path, respectfully, wherein said first feedback path is selected to produce a desired first load system parameter or said second feedback path is selected to produce a second desired load system parameter.

5. A control system according to claim 4, further comprising a controller responsive to at least one of said load system parameter measures to control the switcher.

6. A control system according to claim 4, wherein said first sensor provides a measure of current through the load system and the second sensor provides a measure of voltage across the load system.

* * * * *